(12) United States Patent
Mizusawa

(10) Patent No.: US 7,733,574 B2
(45) Date of Patent: Jun. 8, 2010

(54) ILLUMINATION OPTICAL APPARATUS AND OPTICAL APPARATUS

(75) Inventor: Masayuki Mizusawa, Hachioji (JP)

(73) Assignee: Olympus Corporation, Tokyo (JP)

( * ) Notice: Subject to any disclaimer, the term of this patent is extended or adjusted under 35 U.S.C. 154(b) by 354 days.

(21) Appl. No.: 11/883,087

(22) PCT Filed: Jan. 25, 2006

(86) PCT No.: PCT/JP2006/301593

§ 371 (c)(1),
(2), (4) Date: Jul. 25, 2007

(87) PCT Pub. No.: WO2006/080534

PCT Pub. Date: Aug. 3, 2006

(65) Prior Publication Data

US 2008/0212173 A1 Sep. 4, 2008

(30) Foreign Application Priority Data

Jan. 31, 2005 (JP) ............................. 2005-023680

(51) Int. Cl.
*G02B 9/00* (2006.01)
*G02B 21/06* (2006.01)
(52) U.S. Cl. ...................... 359/649; 359/385
(58) Field of Classification Search ................ 359/385, 359/649–651, 656–661; 369/112.24, 112.26; 355/67; 362/268
See application file for complete search history.

(56) References Cited

U.S. PATENT DOCUMENTS

| 4,851,978 | A | 7/1989 | Ichihara et al. |
| 5,815,248 | A | 9/1998 | Nishi et al. |
| 5,815,249 | A | 9/1998 | Nishi et al. |
| 5,991,009 | A | 11/1999 | Nishi et al. |
| 2002/0012164 | A1 | 1/2002 | Miyashita |

FOREIGN PATENT DOCUMENTS

| EP | 1 367 442 | 12/2003 |
| JP | 06 349710 | 12/1994 |
| JP | 2003-090959 | 3/2003 |
| JP | 2003-218017 | 7/2003 |
| JP | 2004-253750 | 9/2004 |

*Primary Examiner*—William C Choi
(74) *Attorney, Agent, or Firm*—Kenyon & Kenyon LLP

(57) ABSTRACT

There are provided an illumination optical apparatus and an optical apparatus using this illumination optical apparatus that are capable of efficiently collecting light emitted from a light-emitting section for illumination with less illumination nonuniformity, without having to employ a complicated structure. There are provided a light-emitting sections; a lens system for converting a diverging beam emitted from the light-emitting section into a beam of collimated light; an afocal optical system for adjusting the cross-sectional area of a beam of collimated light obtained by the lens array; a fly-eye lens for forming a plurality of light-source images from the collimated light whose cross-sectional area is adjusted by the afocal optical system; and a Koehler illumination optical system that uses the plurality of light-source images formed by the fly-eye lens as a light source.

6 Claims, 7 Drawing Sheets

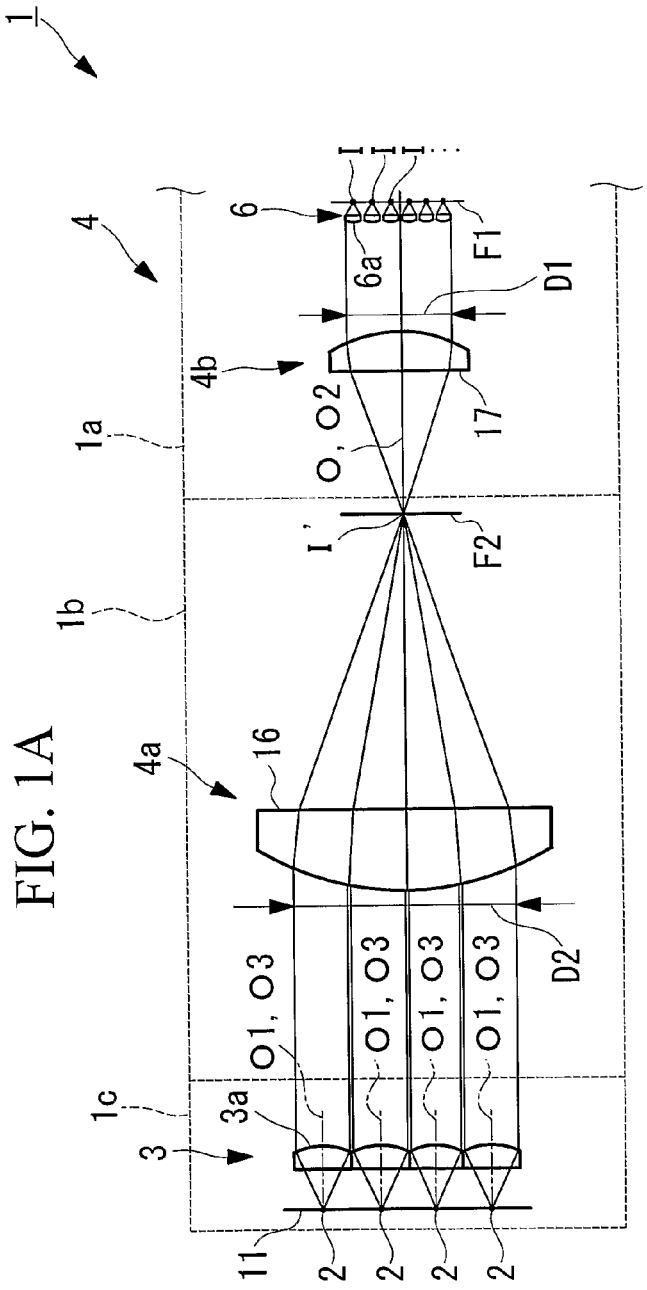
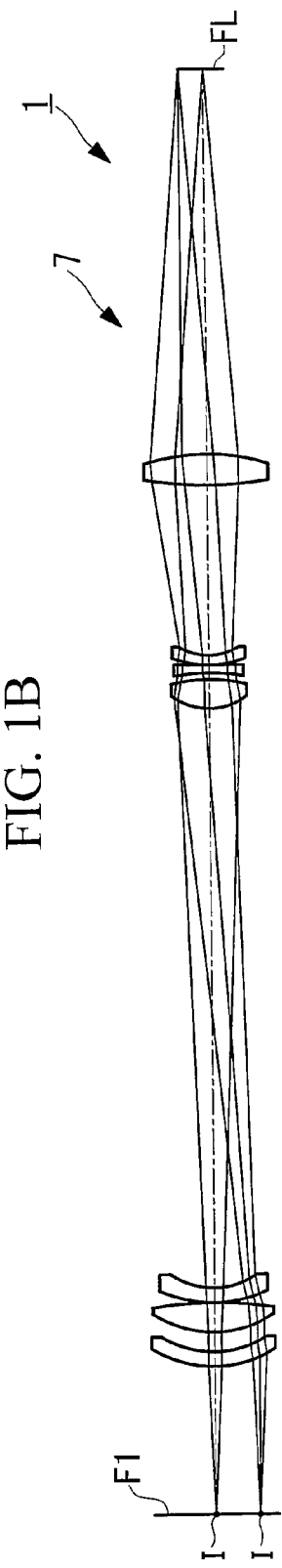
FIG. 1A
FIG. 1B

ILLUMINATION OPTICAL APPARATUS AND OPTICAL APPARATUS

TECHNICAL FIELD

The present invention relates to an illumination optical apparatus, such as a projection apparatus, an exposure apparatus, and a microscope, and to an optical apparatus using such an illumination optical apparatus.

BACKGROUND ART

In an illumination optical system of an optical apparatus, such as a projection apparatus, an exposure apparatus, and a microscope, the ability to illuminate the entire illumination area uniformly and with sufficiently bright light is required.

Known illumination optical apparatuses for realizing such illumination include, for example, the illumination apparatus described in Japanese Unexamined Patent Application Publication No. 6-349710 (refer to the section from line 31 in column 10 to line 30 in column 11, as well as FIG. 7).

This illumination optical apparatus improves, for example, the power of illumination light and the illuminance uniformity in relation to beams emitted by a plurality of light sources by using a fly-eye lens. Furthermore, the illumination optical apparatus splits the beam from each light source with a beam-splitting optical system (half-prism) and makes the beams incident upon the fly-eye lens from different angles to prevent illuminance nonuniformity from occurring.

This illumination optical apparatus, however, is problematic in that, for example, it requires a beam splitting system, which causes the optical system to become complicated. The illumination optical apparatus has another disadvantage in that since high parts precision is required to achieve the desired performance, the apparatus becomes very costly. Furthermore, to efficiently receive at the fly-eye lens light emitted from the light sources while preventing, for example, vignetting, the shapes and the layout of the light sources and the shape of the fly-eye lens are subjected to more restrictions. In addition, a desirable structure is one in which the types, intensity, and the like of the light sources are selectable as required according to, for example, the properties of the specimen to be examined. However, such a structure cannot be employed in the above-described known illumination optical apparatus.

DISCLOSURE OF INVENTION

The present invention has been conceived in light of the above-described circumstances, and it is an object of the present invention to provide an illumination optical apparatus and an optical apparatus using this illumination optical apparatus that are capable of efficiently collecting light emitted from light sources for illumination with less illumination nonuniformity, without having to employ a complicated structure or imposing restrictions upon the shapes and the layout of the light sources and the shape of the fly-eye lens. Preferably, another object of the present invention is to provide an illumination optical apparatus and an optical apparatus using this illumination optical apparatus which allow appropriate light sources to be selected according to, for example, the properties of the specimen to be examined.

To achieve the above-described objects, the present invention provides the following solutions.

The present invention provides an illumination optical apparatus including a light-emitting section; a lens system for converting a diverging beam emitted from the light-emitting section into a beam of collimated light; an afocal optical system for adjusting the cross-sectional area of the beam of collimated light obtained by the lens system; a fly-eye lens for forming a plurality of light-source images from the collimated light whose cross-sectional area is adjusted by the afocal optical system; and a Koehler illumination optical system that uses the plurality of light-source images formed by the fly-eye lens as a light source.

In the illumination optical apparatus with this structure, since diverging light emitted from the light-emitting section is collected by the lens system without waste for use as illumination light, efficient illumination can be achieved.

Furthermore, illumination light collected in this manner is incident upon the fly-eye lens as collimated light through the lens system and afocal optical system, a plurality of light-source images is formed from this collimated light by the fly-eye lens, and this plurality of light-source images is used as a light source for the Koehler illumination optical system. In other words, in this illumination optical apparatus, since a beam of collimated light obtained by the lens system is incident upon the fly-eye lens as illumination light after the cross-sectional area of the beam of collimated light is adjusted by the afocal optical system, vignetting due to the shapes of the constituent lenses of the fly-eye lens does not occur easily. In addition, in this illumination optical apparatus, since the plurality of light-source images formed by the fly-eye lens is superimposed one on another onto an illumination surface from a plurality of directions, illumination with a uniform illuminance distribution can be achieved.

As described above, this illumination optical apparatus allows light emitted from the light-emitting section to be efficiently collected and illumination with less illumination nonuniformity to be performed without having to employ a complicated structure.

Here, the beam diameter of collimated light obtained by the lens system as measured immediately after the collimated light has passed through the afocal optical system is defined as D1, a beam system just before the collimated light is incident upon the afocal optical system is defined as D2, and $\beta$ is defined as $\beta = D1/D2$. If the value of this $\beta$ is below 0.25, the fly-eye lens is too small compared to the light-emitting section, possibly causing the utilization ratio of light emitted from the light-emitting section to decrease. On the other hand, if the value of $\beta$ is above 2, the aperture of the fly-eye lens is too large compared to the effective aperture of the light-emitting section, causing the size of the apparatus to become larger more than necessary.

For this reason, in the illumination optical apparatus according to the present invention, the afocal optical system preferably satisfies the conditional expression $0.25 < \beta < 2$. More preferably, the afocal optical system should satisfy the conditional expression $0.4 < \beta < 1$.

Furthermore, the afocal optical system may include a first group arranged adjacent to the light-emitting section and a second group arranged adjacent to the fly-eye lens, and the first group may form an image of the light-emitting section between the first group and the second group.

In this case, since the pupil position of an image from the light-emitting section (light-source image) can be arranged on the incident plane of the fly-eye lens, light emitted from the light-emitting section can be guided onto the fly-eye lens efficiently.

In this case, the second group of the afocal optical system forms an optical system independent of the first group.

Thus, the afocal optical system may be constructed so that it can be divided between the first group and the second group. In this case, only the first group or both the first group and the light-emitting section can be replaced with ones having different structures. Therefore, optimal illumination can be performed by appropriately selecting only the first group or both the first group and the light-emitting section according to the illumination requirements and properties of the light-emitting section to be used.

Furthermore, in the illumination optical apparatus according to the present invention, the afocal optical system may include an adjustment function of the cross-sectional area of the beam of collimated light obtained by the lens system.

In this case, even if the cross-sectional area of a beam emitted from the light-emitting section changes because the light-emitting section has been replaced, the cross-sectional area of a beam of collimated light that has passed through the afocal optical system can be adjusted to an appropriate size by means of the afocal optical system. This allows light emitted from the light-emitting section to be efficiently collected and illumination with less illumination nonuniformity to be performed.

This adjustment function of the afocal optical system can be achieved, for example, by constructing the afocal optical system such that some lenses are replaceable. In this case, the cross-sectional area of a beam of collimated light which has passed through the afocal optical system can be adjusted to an appropriate size by replacing some lenses with appropriate lenses.

Furthermore, this adjustment function of the afocal optical system can be achieved by providing the afocal optical system with a mechanism for moving some lenses in the direction of the optical axis (e.g., zoom mechanism). In this case, the cross-sectional area of a beam of collimated light that has passed through the afocal optical system can be adjusted to an appropriate size without replacing the afocal optical system.

Here, the afocal optical system may be constructed so as to include a first group arranged adjacent to a plurality of light-emitting sections 2 and a second group arranged adjacent to the fly-eye lens such that the first group is composed of a convex lens or a group of convex lenses, the second group is composed of a concave lens or a group of concave lenses, and the first group adjusts the cross-sectional area of a beam without focusing images from the plurality of light-emitting sections 2 between the first group and the second group. In this case, less power is required for the lenses constituting the afocal optical system, and the less power is required, the more the occurrence of aberrations is suppressed. This leads to easy optical design and low-cost manufacturing.

Furthermore, in the illumination optical apparatus according to the present invention, a plurality of the light-emitting sections may be arranged such that optical axes thereof are parallel with each other, and the lens system may be a lens array that includes a lens element corresponding to each of the plurality of light-emitting sections to convert light emitted from each of the light-emitting sections into collimated light with the corresponding lens element.

In the illumination optical apparatus with this structure, since light emitted from each light-emitting section is collected by the corresponding lens element without waste for use as illumination light, efficient illumination can be achieved. Illumination light collected in this manner is incident upon the fly-eye lens as collimated light through the lens system and afocal optical system, a plurality of light-source images is formed from this collimated light by the fly-eye lens, and this plurality of light-source images is used as a light source for the Koehler illumination optical system. In other words, in this illumination optical apparatus, since illumination light is incident upon the fly-eye lens after the cross-sectional area of a beam of collimated light from the lens system is adjusted by the afocal optical system, vignetting due to the shapes of the constituent lenses of the fly-eye lens does not occur easily. In addition, in this illumination optical apparatus, since the plurality of light-source images formed by the fly-eye lens is superimposed one on another onto the illumination surface from a plurality of directions, illumination with a uniform illuminance distribution can be achieved.

As described above, this illumination optical apparatus allows light emitted from the plurality of light-emitting sections to be efficiently collected and illumination with less illumination nonuniformity to be performed without having to employ a complicated structure.

KF>4KS may hold, where KS is the number of lens elements and KF is the number of constituent lenses constituting the fly-eye lens.

In the illumination optical apparatus with this structure, the fly-eye lens can form four or more light-source images from one light-emitting section. As a result, the Koehler illumination optical system can illuminate the illumination surface from more directions than the number of light-emitting sections. This leads to illumination with an even more uniform illuminance distribution.

The light-emitting sections and the lens elements may be arranged on flat surfaces perpendicular to an optical axis of the afocal optical system such that individual optical axes thereof are parallel with the optical axis of the afocal optical system.

In the illumination optical apparatus with this structure, each lens element can convert light emitted from the corresponding light-emitting section into substantially collimated light, thus keeping the illumination light loss low.

The plurality of light-emitting sections may be constructed so as to emit beams having the same wavelength.

In this case, aberrations (chromatic aberrations) due to differences in the wavelength of light emitted by the light-emitting sections do not occur easily. For this reason, this illumination optical apparatus is easy to optically design and manufacture.

The term "same wavelength" used here does not mean exactly the same wavelength but allows for variations in wavelength originating from individual differences between the light-emitting sections.

In this illumination optical apparatus, the afocal optical system and the fly-eye lens may be replaceable.

In this case, when the illumination optical apparatus according to the present invention is applied to an illumination optical apparatus, such as an epi-illumination apparatus of a microscope, in which at least part (e.g., an objective lens) of a lens group provided downstream of the fly-eye lens can be changed, the afocal optical system and the fly-eye lens can be replaced with ones having appropriate properties according to the properties of this lens group that can be changed. Accordingly, illumination loss does not occur easily.

The present invention provides an optical apparatus including the illumination optical apparatus according to the above-described present invention.

In the illumination optical apparatus with this structure, light emitted from the light-emitting sections can be efficiently collected for illumination with less illumination nonuniformity, without having to employ a complicated structure or imposing restrictions upon the shapes and the layout of the light-emitting sections and the shape of the fly-eye lens.

Such optical apparatuses include, for example, a projection apparatus having a projection optical system for projecting an image with the illumination optical apparatus according to the present invention as a light source; an exposure apparatus having a projection optical system for projecting a mask pattern onto a photosensitive member by using the illumination optical apparatus according to the present invention; and a microscope having an observation optical system for examining a target object illuminated with the illumination optical apparatus according to the present invention.

As described above, according to the present invention, light emitted from the light-emitting sections can be efficiently collected for stable illumination with less illumination nonuniformity, without having to employ a complicated structure or imposing restrictions upon the shapes and the layout of the light-emitting sections and the shape of the fly-eye lens. As a result, brighter illumination can be performed using various types of light-emitting sections, and sufficiently high brightness can be achieved with a light-emitting section having relatively low brightness, such as an LED light-emitting device.

Since LED light-emitting devices exhibit a longer service life than existing light sources, such as filament and arc lamps, using an LED light-emitting device as a light-emitting section means that users will not need to replace the light-emitting section for an extended period of time.

Furthermore, according to the present invention, a light-emitting section can be selected according to, for example, the properties of the specimen to be examined.

BRIEF DESCRIPTION OF DRAWINGS

FIG. 1A is a diagram partially showing the structure of an illumination optical apparatus according to a first embodiment of the present invention.

FIG. 1B is a diagram partially showing the structure of an illumination optical apparatus according to the first embodiment of the present invention.

BEST MODE FOR CARRYING OUT THE INVENTION

Figure 2:
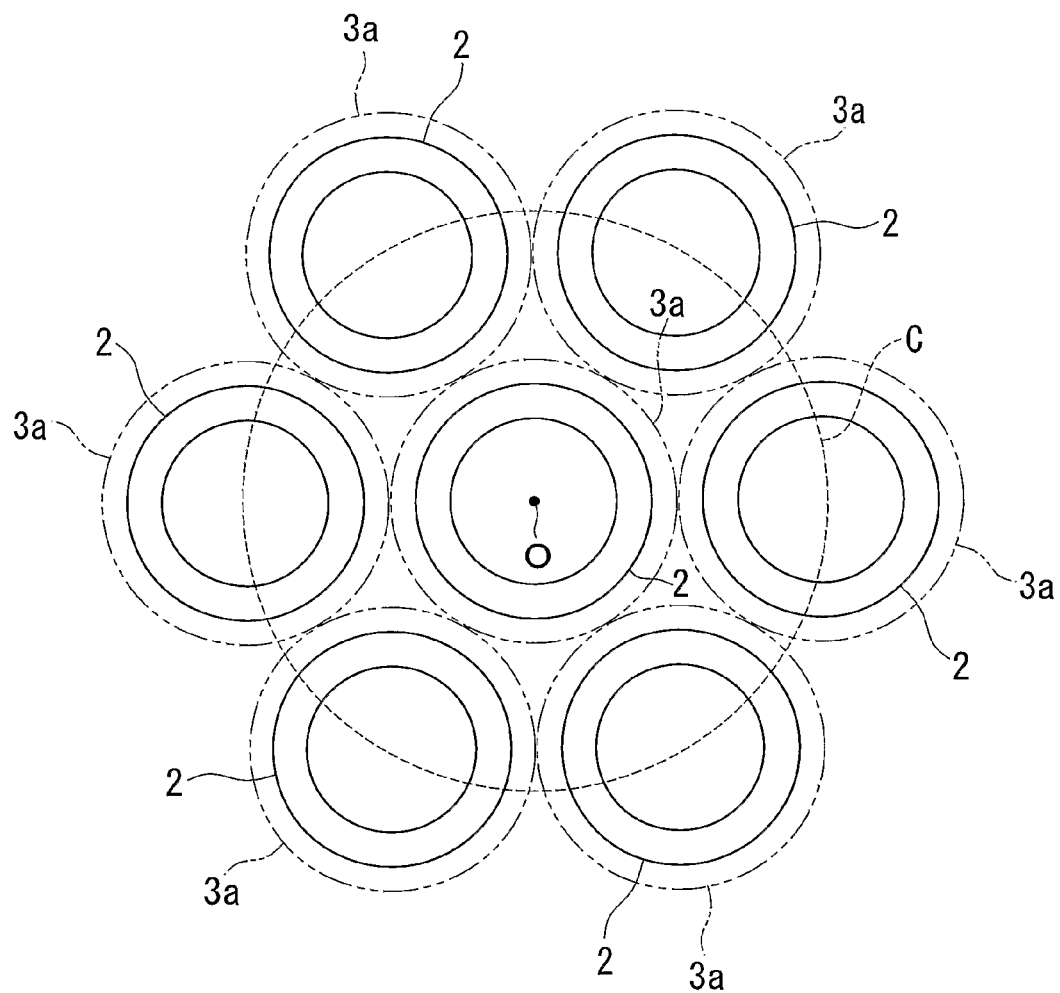
FIG. 2 is a diagram showing a light-emitting section and a lens array of the illumination optical apparatus shown in FIG. 1A, as viewed from the optical-axis direction.

Preferred embodiments of an optical apparatus according to the present invention will now be described with reference to the drawings.

First Embodiment

An optical apparatus according to the present invention is an optical apparatus including an illumination optical apparatus according to the present invention. More specifically, the optical apparatus according to the present invention is, for example, a projection apparatus having a projection optical system for projecting an image with the illumination optical apparatus according to the present invention as a light source; an exposure apparatus having a projection optical system for projecting a mask pattern onto a photosensitive member by using the illumination optical apparatus according to the present invention; and a microscope having an observation optical system for examining a target object illuminated with the illumination optical apparatus according to the present invention.

This embodiment is described by way of an example where the present invention is applied to a microscope having an illumination optical apparatus 1, shown in FIG. 1A and FIG. 1B, and an observation optical system for examining an illumination surface (object to be examined) illuminated with this illumination optical apparatus 1.

The illumination optical apparatus 1 includes light-emitting sections 2 (light sources); a lens system 3 for converting diverging beams emitted from the light-emitting sections 2 into beams of collimated light; an afocal optical system 4 for adjusting the cross-sectional areas of the beams of collimated light obtained by the lens system 3; a fly-eye lens 6 for forming a plurality of light-source images I from the collimated beam whose cross-sectional area is adjusted by the afocal optical system 4; and a Koehler illumination optical system 7 which uses the plurality of light-source images I formed by the fly-eye lens 6 as a light source.

In this embodiment, the plurality of light-emitting sections 2 are arranged such that their optical axes are parallel with one another. For the lens system 3, a lens array (hereinafter referred to as the "lens array 3") including lens elements 3a corresponding to the light-emitting sections 2, respectively, is provided to convert, using these lens elements 3a, light emitted from the respective light-emitting sections 2 into collimated light.

In this specification, the structure of the illumination optical apparatus 1 is divided into two for illustration, one shown in FIG. 1A and the other in FIG. 1B, at the position where many light-source images I are formed by the fly-eye lens 6 (i.e., a back focal plane F1 of the fly-eye lens 6). Furthermore, the structure shown in FIG. 1A and the structure shown in FIG. 1B are arranged in a line along an optical axis O of the illumination optical apparatus 1.

For the light-emitting sections 2, devices having directivity, such as LED light-emitting devices, or non-directional light sources, such as filament or arc lamps, provided with elliptical mirrors for focusing the rays emitted thereby to exhibit directivity can be used.

As shown in FIG. 1A and FIG. 2, the illumination optical apparatus 1 according to this embodiment includes an LED-array light source 11 in which a plurality of LED light-emitting devices are arranged on a flat surface, and the LED light-emitting devices of this LED-array light source 11 are used as the light-emitting sections 2. Furthermore, the LED light-emitting devices of this LED-array light source 11 are constructed so as to emit light with substantially the same wavelength.

As shown in FIG. 1A, in this LED-array light source 11, optical axes O1 of the light-emitting sections 2 formed of the LED light-emitting devices are made substantially perpendicular to the surface on which the light-emitting sections 2 are arranged, and the LED-array light source 11 is arranged such that the optical axes O1 of the light-emitting sections 2 are substantially parallel with an optical axis O2 of the afocal optical system 4. In other words, the light-emitting sections 2 are arranged on the flat surface substantially perpendicular to the optical axis O2 of the afocal optical system 4 such that their individual optical axes O1 are substantially parallel with the optical axis O2 of the afocal optical system 4.

In addition, the light-emitting sections 2 are arranged so as to have the maximum possible density when viewed from the direction along the optical axis O of the illumination optical apparatus 1.

As shown by the solid lines in FIG. 2, according to this embodiment, one light-emitting section 2 of the light-emitting sections 2 is arranged coaxially with the optical axis O, and six light-emitting sections 2 are arranged at substantially regular intervals on a circumference C having this light-emitting section 2 as the center thereof. These light-emitting sections 2 are arranged as densely as possible while the minimum required spaces for wiring or the like are ensured between the light-emitting sections 2. In this manner, by arranging the light-emitting sections 2 in a high-density manner, the density of light incident upon the afocal optical system 4 is increased to achieve brighter illumination.

The lens array 3 is constructed such that a plurality of lens elements 3a having positive power are arranged on a flat surface substantially perpendicular to optical axes O3 thereof. Furthermore, this lens array 3 is disposed such that the optical axis O3 of each lens element 3a is substantially parallel with the optical axis O2 of the afocal optical system 4. In other words, the lens elements 3a are arranged on the flat surface substantially perpendicular to the optical axis O2 of the afocal optical system 4 such that their individual optical axes O3 are substantially parallel with the optical axis O2 of the afocal optical system 4.

In addition, this lens array 3 is arranged at a position where the object-side focal points of the lens elements 3a correspond to the light-emitting sections 2, respectively. In other words, the lens elements 3a are arranged so as to be substantially coaxial with the corresponding light-emitting sections 2.

As shown by the two-dot chain lines in FIG. 2, according to this embodiment, one lens element 3a of the lens elements 3a is arranged coaxially with the optical axis O, and six lens elements 3a are arranged at substantially regular intervals on the circumference C having this lens element 3a as the center thereof. In addition, the diameter of each lens element 3a is set so as to minimize the gap between the neighboring lens elements 3a. In other words, the lens array 3 is constructed so as to convert light emitted from the light-emitting sections 2 into collimated light using substantially the entirety thereof. In this manner, by arranging the lens elements 3a in a high-density manner, the density of light incident upon the afocal optical system 4 is increased to achieve brighter illumination.

The afocal optical system 4 includes a first group 4a arranged adjacent to the plurality of light-emitting sections 2 and a second group 4b arranged adjacent to the fly-eye lens 6. Furthermore, the optical axis O2 of the afocal optical system 4 corresponds to the optical axis O of the illumination optical apparatus 1.

In this embodiment, the first group 4a focuses images of the light-emitting sections 2 between the first group 4a and the second group 4b.

More specifically, the first group 4a is formed of a focusing lens 16 for converging collimated beams obtained by the lens array 3 to focus images I' from the plurality of light-emitting sections 2, one superimposed on another, between the first group 4a and the second group 4b. In addition, the second group 4b is formed of a collimator lens 17 for re-converting into collimated beams the beams emitted from the images of the light-emitting sections 2 formed by the first group 4a and for guiding the collimated beams onto the fly-eye lens 6.

By doing so, since the pupil positions of the images from the light-emitting sections 2 (light-source images) can be arranged on the incident plane of the fly-eye lens 6, light emitted from the light-emitting sections 2 can be guided onto the fly-eye lens 6 efficiently.

Here, the afocal optical system 4 is constructed such that β satisfies the conditional expression 0.25<β<2, where β=D1/D2, where D1 is the beam diameter of collimated light obtained by the lens array 3 as measured immediately after the collimated light has passed through the afocal optical system 4 and D2 is a beam system just before the collimated light is incident upon the afocal optical system 4.

In this embodiment, since the afocal optical system 4 is constructed so as to reduce the cross-sectional areas of collimated beams obtained by the lens array 3 (i.e., β<1), the collimated beams that have passed through the afocal optical system 4 exhibit intensities that are increased by amounts corresponding to the reduction in the cross-sectional areas.

Also in this embodiment, the second group 4b is provided in a housing 1a of the illumination optical apparatus 1, as shown in FIG. 1A. A lens unit 1b is detachably mounted on the housing 1a with a detachable connection structure, such as a male/female-coupling or screw-connection (threaded-connection) structure, and the first group 4a is provided in this lens unit 1b. Because of this, the lens unit 1b can be removed from the housing 1a, so that instead of this lens unit 1b, a lens unit 1b having a differently constructed first group 4a can be installed in the housing 1a.

By replacing the lens unit 1b with another one having an appropriate structure in this manner according to the illumination requirements and properties of the light-emitting sections 2 to be used, various parameters including the value of the above-described β can be optimized to perform optimal illumination.

A light source block 1c is mounted detachably on the lens unit 1b with a detachable connection structure, such as a male/female coupling or screw connection, and the light-emitting sections 2 and the lens array 3 are provided in this light source block 1c (alternatively, only the light-emitting sections 2 may be provided in the light source block 1c, and the lens array 3 may be provided in the lens unit 1b).

Because of this, the light source block 1c can be removed from the lens unit 1b, so that instead of this light source block 1c, a light source block 1c having differently constructed light-emitting sections 2 can be installed in the lens unit 1b, which allows the light-emitting sections 2 to be easily changed to other types.

Alternatively, the lens unit 1b may be removed from the housing 1a to install a light source block 1c provided with only one light-emitting section 2 in the housing 1a. In this case, the light-emitting section 2 is arranged on a front focal plane F2 of the second group 4b (preferably on the front focal point).

Here, the afocal optical system 4 may have a function for adjusting the cross-sectional areas of the beams of collimated light obtained by the lens array 3.

This adjustment function of the afocal optical system 4 can be achieved, for example, by constructing the afocal optical system 4 such that some lenses are replaceable. In this case, the cross-sectional areas of the beams of collimated light that have passed through the afocal optical system 4 can be adjusted to appropriate sizes by replacing some lenses with appropriate lenses.

Furthermore, this adjustment function of the afocal optical system 4 can be achieved, for example, by providing the afocal optical system 4 with a mechanism for moving some lenses in the direction of the optical axis O (e.g., zoom mechanism).

In this case, even if the cross-sectional areas of beams emitted from the light-emitting sections 2 change, for example, because the light-emitting sections 2 have been replaced, the cross-sectional areas of beams of collimated light that have passed through the afocal optical system 4 can be adjusted to appropriate sizes by means of the afocal optical system 4. This allows light emitted from the light-emitting sections 2 to be efficiently collected and illumination with less illumination nonuniformity to be performed without having to replace the afocal optical system 4.

The fly-eye lens 6 is constructed such that a plurality of constituent lenses 6a having positive power is arranged on a flat surface substantially perpendicular to the optical axes thereof. In addition, the fly-eye lens 6 is arranged such that the optical axes of the constituent lens 6a are substantially parallel with the optical axis O2 of the afocal optical system 4. In other words, the constituent lenses 6a are arranged on the flat surface substantially perpendicular to the optical axis O2 of the afocal optical system 4 such that their individual optical axes are substantially parallel with the optical axis O2 of the afocal optical system 4.

In this embodiment KF>4KS holds, where KS is the number of lens elements 3a of the lens array 3 and KF is the number of constituent lenses 6a constituting the fly-eye lens 6.

In addition, to allow collimated light coming from the afocal optical system 4 to be utilized efficiently, the constituent lenses 6a are arranged so as to have the maximum possible density when viewed from the direction along the optical axis O of the illumination optical apparatus 1. The layout pattern of these constituent lenses 6a can be made the same as that of the above-described light-emitting sections 2 and the lens elements 3a of the lens array 3.

Figure 3:
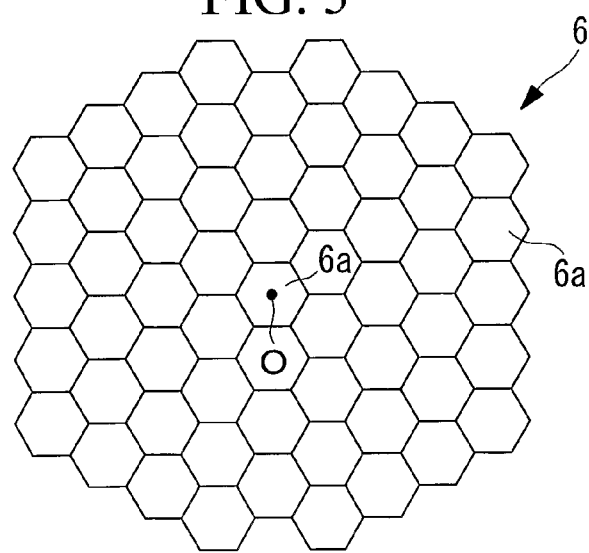
FIG. 3 is a diagram showing a fly-eye lens of the illumination optical apparatus shown in FIG. 1A, as viewed from the optical-axis direction.

In this embodiment, as shown in FIG. 3, each constituent lens 6a of the fly-eye lens 6 is shaped like a substantially regular hexagon when viewed from the direction of the optical axis O, where one constituent lens 6a is arranged coaxially with the optical axis O and many other constituent lenses 6a are arranged neighboring one another so as to surround the circumference of this constituent lens 6a at the center with their perimeters in close contact with one another.

The Koehler illumination optical system 7 makes the illuminance distribution on an illumination surface FL uniform by superimposing beams from the light-source images I formed by the fly-eye lens 6 onto the illumination surface FL from a plurality of directions.

In this illumination optical apparatus 1, since light emitted from each light-emitting section 2 is collected by the corresponding lens element 3a of the lens array 3 without waste for use as illumination light, efficient illumination can be achieved.

In this embodiment, particularly since the plurality of light-emitting sections 2 and the lens elements 3a of the lens array 3 are disposed on the flat surfaces perpendicular to the optical axis O2 of the afocal optical system 4 such that their individual optical axes O1, O3 are parallel with the optical axis O2 of the afocal optical system 4, each lens element 3a of the lens array 3 can convert light emitted from the corresponding light-emitting section 2 into substantially collimated light, thus keeping the illumination light loss low.

In addition, since illumination light is incident upon the fly-eye lens 6 as collimated light, vignetting due to the shapes of the constituent lenses 6a of the fly-eye lens 6 does not occur easily. Furthermore, since the Koehler illumination optical system 7 superimposes diverging beams emitted by the plurality of light-source images I formed by the fly-eye lens 6 onto the illumination surface FL from a plurality of directions, illumination with a uniform illuminance distribution can be achieved.

In addition, in this illumination optical apparatus 1, the number of constituent lenses 6a constituting the fly-eye lens 6 is set as a value equal to or larger than four times the number of lens elements 3a of the lens array 3. Thus, since the fly-eye lens 6 forms four or more light-source images I from one light-emitting section 2, the Koehler illumination optical system 7 can illuminate the illumination surface FL from more directions than the number of light-emitting sections 2. This leads to illumination with an even more uniform illuminance distribution.

As described above, this illumination optical apparatus 1 allows light emitted from the plurality of light-emitting sections 2 to be efficiently collected and illumination with less illumination nonuniformity to be performed without having to employ a complicated structure.

Furthermore, in this illumination optical apparatus 1, since light sources emitting light having the same wavelength are used as the light-emitting sections 2, aberrations (chromatic aberrations) due to differences in the wavelength of light emitted by the light-emitting sections 2 do not occur easily. For this reason, this illumination optical apparatus 1 is easy to optically design and manufacture.

In addition, in this illumination optical apparatus 1, the optical system constituting the section from the second group 4b of the afocal optical system 4 to the Koehler illumination optical system 7 constitutes an illumination optical system having a single light source as a light source. In short, the illumination optical apparatus 1 according to the present invention can be manufactured merely by adding the plurality of light-emitting sections 2, the lens array 3, and the first group 4a of the afocal optical system 4 to a known illumination optical apparatus which utilizes a single light source as a light source. This leads to low manufacturing costs.

Although each of the first group 4a and the second group 4b of the afocal optical system 4 is composed of a single lens in this embodiment, at least one of the first group 4a and the second group 4b may be composed of a plurality of lenses so that disadvantages such as aberrations of the afocal optical system 4 are eliminated, thus achieving superior illumination.

Figure 4:
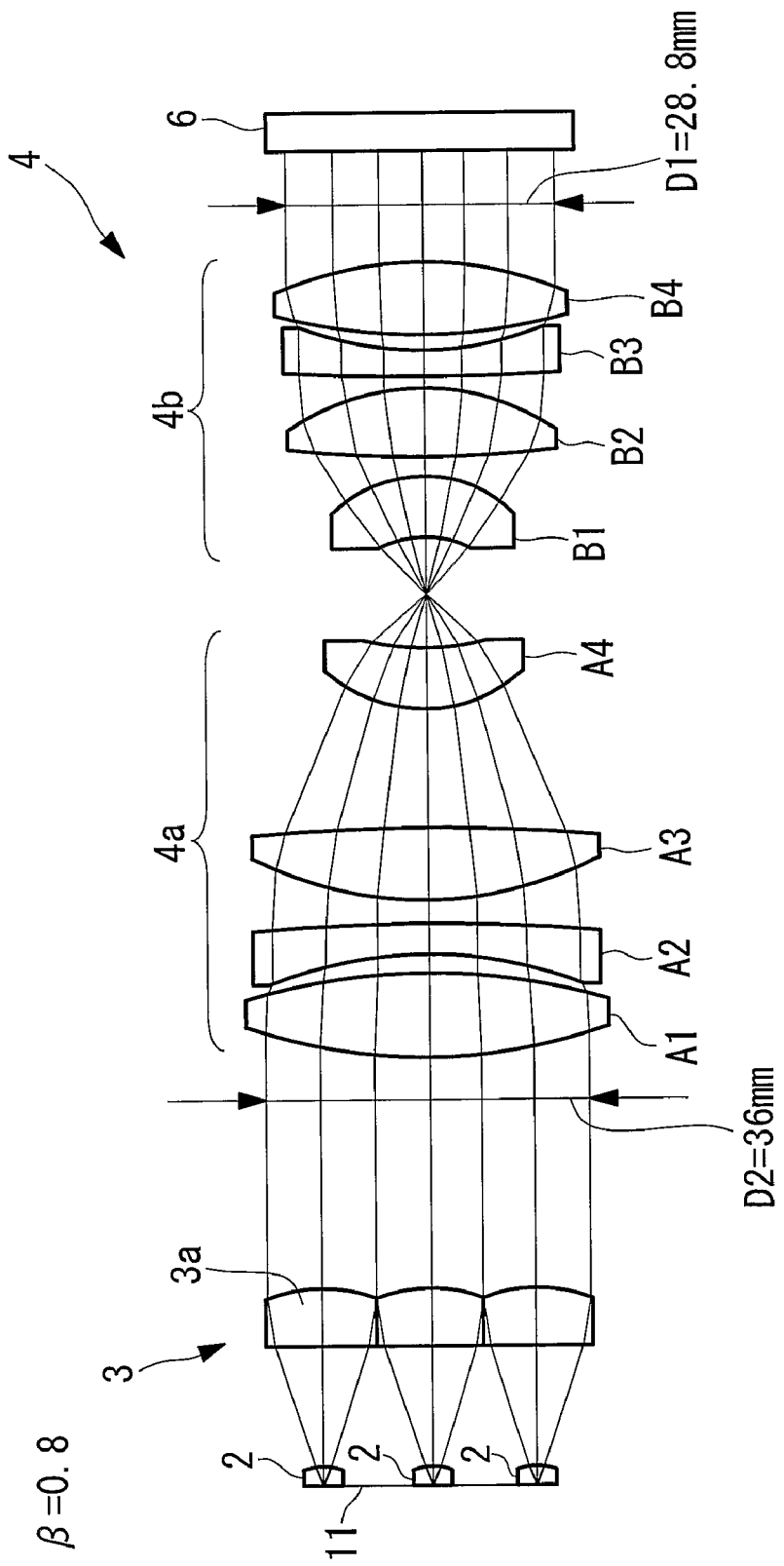
FIG. 4 is a diagram showing another exemplary structure of an afocal optical system of an illumination optical apparatus according to the first embodiment of the present invention.
Figure 5:
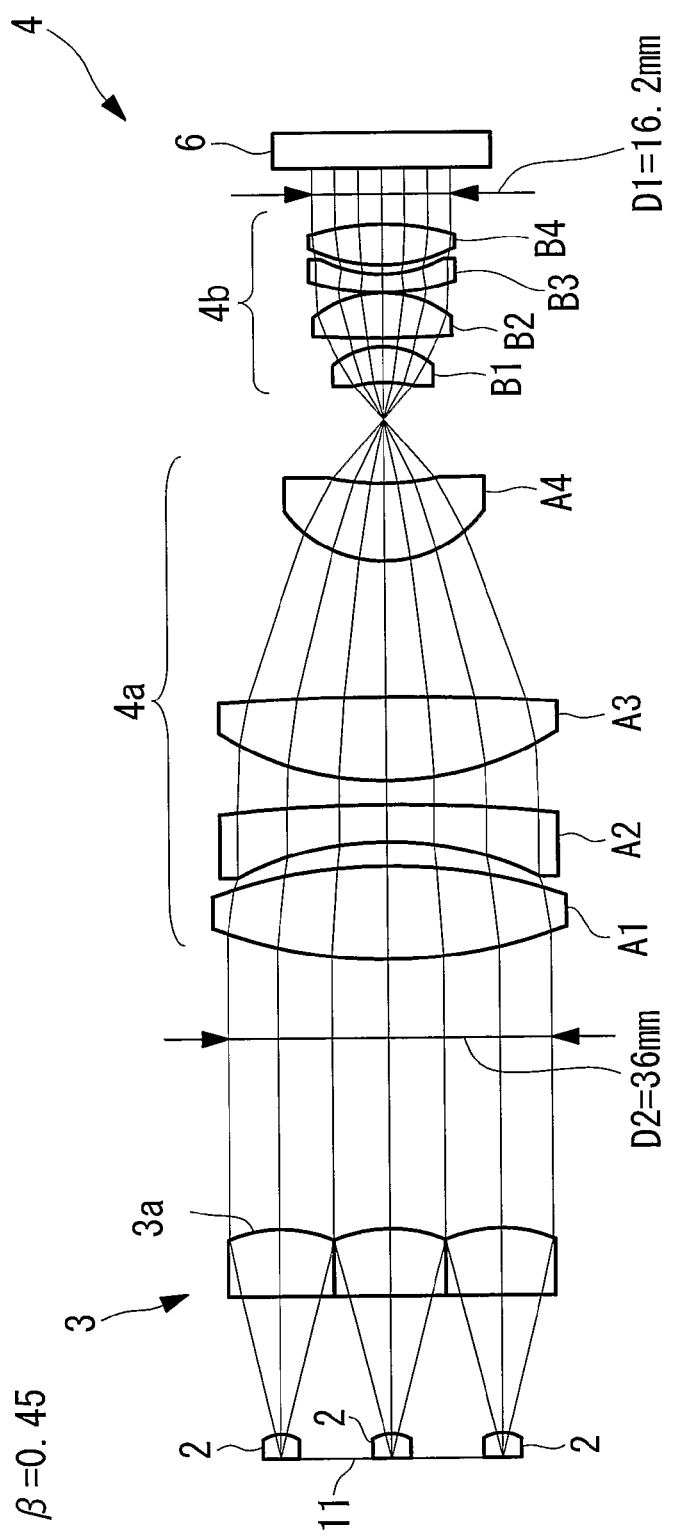
FIG. 5 is a diagram showing another exemplary structure of an afocal optical system of an illumination optical apparatus according to the first embodiment of the present invention.

For example, as shown in FIG. 4 and FIG. 5, a biconvex lens A1, a concave meniscus lens A2, a biconvex lens A3, and a convex meniscus lens A4 may be provided as the first group 4a in that order from the light-emitting sections 2; and a convex meniscus lens B1, a biconvex lens B2, a concave meniscus lens B3, and a biconvex lens B4 may be provided as the second group in that order from the light-emitting sections 2. In the example shown in FIG. 4, D1=28.8 mm, D2=36 mm, and $\beta$=0.8, and in the example shown in FIG. 5, D1=16.2 mm, D2=36 mm, and $\beta$=0.45.

Figure 6A:
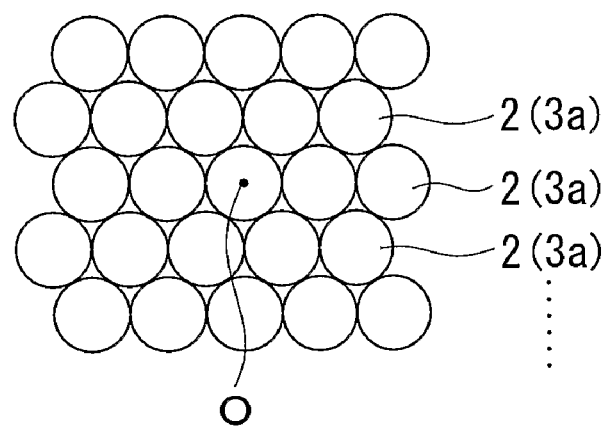
FIG. 6A is a diagram showing another exemplary layout of light-emitting sections, lens elements, and constituent lenses of the illumination optical apparatus shown in FIG. 1A.
Figure 6B:
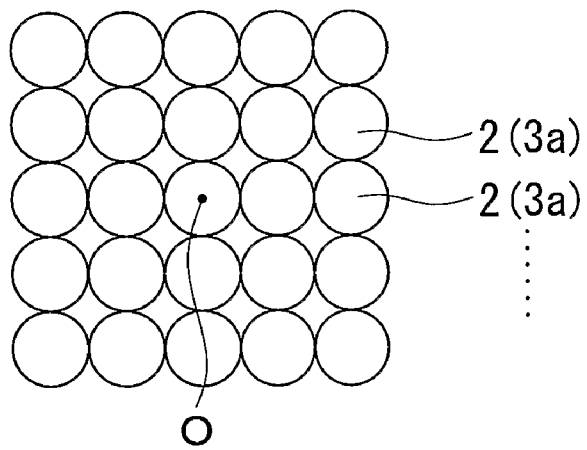
FIG. 6B is a diagram showing another exemplary layout of light-emitting sections, lens elements, and constituent lenses of the illumination optical apparatus shown in FIG. 1A.

Although, in this embodiment, the plurality of light-emitting sections 2 (lens element 3a) are arranged at regular intervals around one light-emitting section 2 (lens element 3a), this embodiment is not limited to this example. A different layout pattern may be employed as long as a high-density layout is possible. For example, as shown in FIG. 6A, the plurality of light-emitting sections 2 (lens elements 3a) may be arranged in a zigzag manner (in a stacked-bale manner) such that the gaps between the light-emitting sections 2 (between the lens elements 3a) are minimized or, as shown in FIG. 6B, they may be arranged in the shape of a rectangle having the optical axis O as the center thereof when viewed from the direction of the optical axis O.

Furthermore, although the plurality of light-emitting sections 2 is provided in this embodiment, the present embodiment is not limited to this example; only one light-emitting section 2 may be provided. In this case, only one lens element 3a is used instead of the lens array 3.

Figure 7:
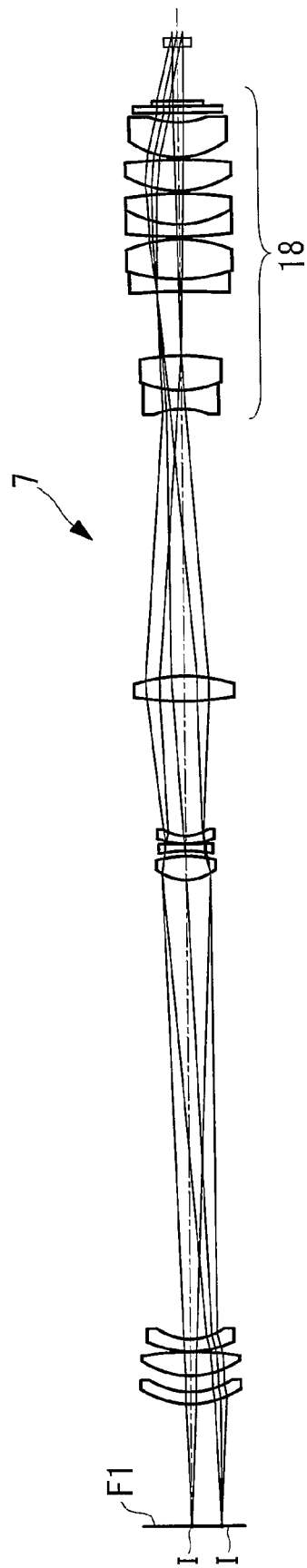
FIG. 7 is a diagram showing another exemplary structure of an illumination optical apparatus according to the first embodiment of the present invention.

In addition, the optical apparatus according to this embodiment may be a microscope which utilizes the illumination optical apparatus 1 as an epi-illumination apparatus. An epi-illumination apparatus is constructed so as to have an objective lens 18 downstream of the Koehler illumination optical system 7 of the illumination optical apparatus 1, as shown in FIG. 7, for example. Furthermore, this objective lens 18 can be replaced, as required, with another one having an appropriate magnification.

In addition, in this microscope, the afocal optical system 4 and the fly-eye lens 6 of the illumination optical apparatus 1 may be replaceable. This allows the afocal optical system 4 and the fly-eye lens 6 to be replaced with appropriate ones according to the properties of the objective lens 18, preventing illumination loss from occurring easily.

Here, installing the afocal optical system 4 and the fly-eye lens 6 in an optical unit which is detachably provided in the illumination optical apparatus 1 allows the afocal optical system 4 and the fly-eye lens 6 to be replaced easily simply by replacing the optical unit.

Second Embodiment

A second embodiment of the present invention will now be described.

Figure 8:
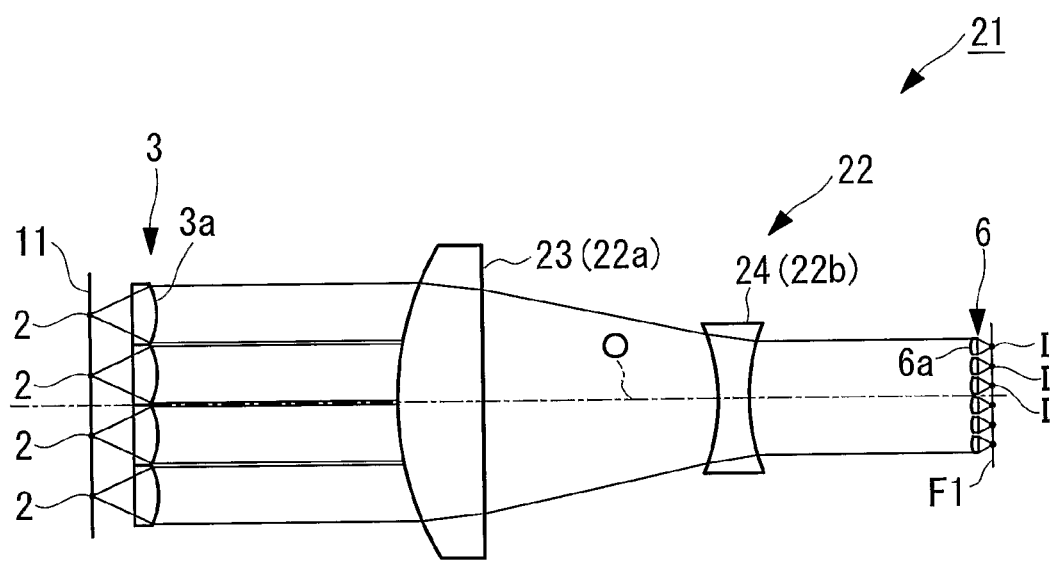
FIG. 8 is a diagram showing the structure of an illumination optical apparatus according to a second embodiment of the present invention.

An optical apparatus according to this embodiment illuminates an illumination surface by using an illumination optical apparatus 21 shown in FIG. 8.

The illumination optical apparatus 21 is mainly characterized in that it is provided with an afocal optical system 22, instead of the afocal optical system 4 of the illumination optical apparatus 1 described in the first embodiment.

The afocal optical system 22 includes a first group 22a arranged adjacent to the plurality of light-emitting sections 2 and a second group 22b arranged adjacent to the fly-eye lens 6.

In this embodiment, the first group 22a is composed of a convex lens 23, and the second group 22b is composed of a concave lens 24. As a result, the first group 22a is constructed so as to adjust the cross-sectional area of a beam without focusing the images from the plurality of light-emitting sections 2 between the first group 22a and the second group 22b.

In the illumination optical apparatus 21 with the above-described structure, less power is required for the lenses (convex lens 23 and concave lens 24) in the first group 22a and the second group 22b constituting the afocal optical system 22, and the less power is required, the more the occurrence of aberrations is suppressed. This leads to easy optical design and low-cost manufacturing.

The invention claimed is:

1. An illumination optical apparatus comprising:
    a light-emitting section;
    a lens system for converting a diverging beam emitted from the light-emitting section into a beam of collimated light;
    an afocal optical system for adjusting the cross-sectional area of the beam of collimated light obtained by the lens system;
    a fly-eye lens for forming a plurality of light-source images from the collimated light whose cross-sectional area is adjusted by the afocal optical system; and
    a Koehler illumination optical system that uses the plurality of light-source images formed by the fly-eye lens as a light source, wherein
    a plurality of the light-emitting sections is arranged such that optical axes thereof are parallel with each other, and
    the lens system is a lens array that includes a lens element corresponding to each of the plurality of light-emitting sections to convert light emitted from each of the light-emitting sections into collimated light with the corresponding lens element.

2. The illumination optical apparatus according to claim 1, wherein KF>4KS holds, where KS is the number of lens elements and KF is the number of constituent lenses constituting the fly-eye lens.

3. The illumination optical apparatus according to claim 1, wherein the light-emitting sections and the lens elements are arranged on flat surfaces perpendicular to an optical axis of the afocal optical system such that individual optical axes thereof are parallel with the optical axis of the afocal optical system.

4. The illumination optical apparatus according to claim 1, wherein the plurality of light-emitting sections are constructed so as to emit beams having the same wavelength.

5. The illumination optical apparatus according to claim 1, wherein the afocal optical system and the fly-eye lens are replaceable.

6. An optical apparatus comprising the illumination optical apparatus according to claim 1.

* * * * *